(12) United States Patent
Hsiao

(10) Patent No.: US 7,714,395 B2
(45) Date of Patent: May 11, 2010

(54) STATIC RANDOM ACCESS MEMORY AND FABRICATING METHOD THEREOF

(75) Inventor: Chung-Li Hsiao, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 276 days.

(21) Appl. No.: 11/945,094

(22) Filed: Nov. 26, 2007

(65) Prior Publication Data

US 2009/0134464 A1    May 28, 2009

(51) Int. Cl.
*G11C 11/40*    (2006.01)
*H01L 21/336*    (2006.01)
*H01L 29/78*    (2006.01)

(52) U.S. Cl. ............... 257/384; 438/279; 257/E27.059; 257/E27.098; 257/E21.661

(58) Field of Classification Search .................. 365/182, 365/188; 257/384, E27.059, E27.098, E21.661; 438/279
See application file for complete search history.

(56) References Cited

U.S. PATENT DOCUMENTS

| | | | | |
|---|---|---|---|---|
| 5,573,980 A * | 11/1996 | Yoo | ............................ | 438/586 |
| 6,326,669 B1 | 12/2001 | Hwang et al. | | |
| 6,777,734 B2 * | 8/2004 | Min | ............................ | 257/296 |
| 6,992,916 B2 * | 1/2006 | Liaw | ............................ | 365/154 |
| 2004/0207028 A1 * | 10/2004 | Min | ............................ | 257/393 |

* cited by examiner

*Primary Examiner*—Evan Pert
(74) *Attorney, Agent, or Firm*—Winston Hsu

(57) ABSTRACT

A static random access memory at least includes: pluralities of transistors disposed on a substrate, each transistor at least includes a gate, a gate dielectric layer, a source doped region and a drain doped region, in which some of the source doped regions are used for connecting with a Vss voltage or a Vdd voltage, and a salicide layer disposed on the gates, the source doped regions except those source doped regions used for connecting a Vss voltage and a Vdd voltage and the drain doped regions.

16 Claims, 16 Drawing Sheets

STATIC RANDOM ACCESS MEMORY AND FABRICATING METHOD THEREOF

BACKGROUND OF THE INVENTION

1. Field of the Invention

The present invention relates to a semiconductor device and a fabricating method thereof, and in particular, to a static random access memory (SRAM) and a fabricating method thereof.

2. Description of Related Art

Random access memory devices can be mainly classified into dynamic random access memories (DRAMs) and static random access memories (SRAMs). The SRAMs are advantageous in high speed operation and lower power consumption. Moreover, compared with the DRAMs, the SRAMs need not to be re-charged periodically, so the design and the fabrication thereof are simplified. Hence, the SRAMs are widely employed in information electronic products.

Generally, a memory cell of the SRAM includes two drive transistors, two load devices and two access transistors. The load devices can be resistors or transistors. Therefore, according to the types of the load devices, the SRAM can be classified into a 4T2R SRAM formed by 4 transistors and 2 resistors, and a 6T SRAM formed by 6 transistors. The 4T2R SRAM can be, for example, a high load resistor SRAM (HLR SRAM). The 6T SRAM can be, for example, a full complementary metal-oxide-semiconductor SRAM (Full CMOS SRAM) or a thin film transistor SRAM (TFT SRAM). In terms of the requirement of fabricating the SRAM having low power and a low voltage, the SRAM having a memory cell formed by 6 transistors (6T) has higher stability.

Generally, in order to reduce the resistance of the SRAM and promote the operating speed of the SRAM, the salicide is formed on the gate of the transistor and on the active region of the silicon substrate in the SRAM. Although the salicide has the aforesaid advantages, a current leakage problem might occur due to a spiking effect caused by the salicide formed on the active region. Under the circumstance that a space of the active region is larger, the current leakage problem caused by the spiking effect is slight and even can be ignored. However, as the size of the devices are continuously miniaturized and the level of the integration of the devices increases accordingly, when the space in the active region is narrowed to some extent, the current leakage problem caused by the spiking effect can no longer be ignored.

SUMMARY OF THE INVENTION

The present invention is directed to a static random access memory (SRAM) and a fabricating method thereof, which can alleviate a current leakage problem in the SRAM.

The present invention provides a SRAM. The SRAM at least includes a plurality of transistors disposed on a substrate, wherein each of the transistors at least includes a gate, a gate dielectric layer, a source doped region and a drain doped region, and some of the source doped regions are used for connecting a Vss voltage or a Vdd voltage; a salicide layer disposed on the gates, the source doped regions except those source doped regions used for connecting a Vss voltage and a Vdd voltage and the drain doped regions.

According to an embodiment of the present invention, in the SRAM, each source doped regions used for connecting the Vss voltage and the Vdd voltage further includes an area used for contacting a contact plug, wherein the salicide layer is formed on the area used for contacting the contact plug.

The present invention provides a fabricating method of an SRAM. The fabricating method includes forming a plurality of transistors disposed on a substrate, wherein each of the transistors at least includes a gate, a gate dielectric layer, a source doped region and a drain doped region, and some of the source doped regions are used for connecting a Vss voltage or a Vdd voltage. Then, a salicide layer is formed on the gates, the source doped regions except those source doped regions used for connecting a Vss voltage and a Vdd voltage and the drain doped regions.

According to an embodiment of the present invention, in the fabricating method of the SRAM, a step of forming the salicide layer includes forming a salicide blocking film on the substrate. Then, the salicide blocking film is patterned to expose the gates, the source doped regions except the source doped regions used for connecting the Vss voltage and the Vdd voltage, and the drain doped regions. The salicide layer is formed on the exposed gates, the exposed source doped regions, and the exposed drain doped regions.

According to an embodiment of the present invention, in the fabricating method of the SRAM, each source doped regions used for connecting the Vss voltage and the Vdd voltage further includes an area used for contacting a contact plug. The step of forming the salicide layer includes forming the salicide layer on the gates, the source doped regions except those source doped regions used for connecting a Vss voltage and a Vdd voltage, the drain doped regions and the areas used for contacting the contact plug.

According to an embodiment of the present invention, in the fabricating method of the SRAM, the step of forming the salicide layer includes forming a salicide blocking film on the substrate. Then, the salicide blocking film is patterned to expose the gates, the source doped regions except the source doped regions used for connecting the Vss voltage and the Vdd voltage, the drain doped regions, and the areas used for contacting the contact plug. Next, the salicide layer is formed on the exposed gate, the exposed source doped regions, the exposed drain doped region, and the exposed area used for contacting the contact plug.

According to an embodiment of the present invention, in the fabricating method of the SRAM, the source doped regions used for connecting the Vss voltage or the Vdd voltage are disposed between two of the gates in some of the gates. The step of forming the salicide layer includes forming a salicide blocking film on the substrate. Between two of the gates, a thickness of the salicide blocking film is larger than a height of the gate. A patterned photoresist layer is formed on the salicide blocking film to cover an area on which the salicide is not formed. The photoresist layer is used as a mask to remove the salicide blocking film for forming the patterned salicide blocking film on the substrate between the two gates and for exposing the gates, the source doped regions outside an area between any two of the gates, and the drain doped regions. The salicide layer is formed on the exposed gates, the exposed source doped regions, and the exposed drain doped regions.

According to an embodiment of the present invention, in the fabricating method of the SRAM, a material of the salicide blocking film includes silicon oxide or silicon nitride.

According to an embodiment of the present invention, in the SRAM and the fabricating method thereof, the SRAM includes a memory cell constituted by a plurality of the transistors, and a number of the transistors in each of the memory cells are 4, 6, 8 or 12.

According to an embodiment of the present invention, in the SRAM and the fabricating method thereof, the transistor can be a P-type metal-oxide-semiconductor (MOS) transistor or an N-type MOS transistor.

According to an embodiment of the present invention, in the SRAM and the fabricating method thereof, a material of the salicide layer includes cobalt silicide, titanium silicide, tungsten silicide, tantalum silicide, molybdenum silicide or nickel silicide.

In light of the above, the salicide layer is not formed on the source doped regions used for connecting the Vss voltage and Vdd voltage in the transistor, such that the current leakage problem in a memory device can be alleviated.

Moreover, the salicide layer is not formed on the source doped regions used for connecting the Vss voltage and Vdd voltage in the transistor, but the salicide layer is formed on the area used for contacting the contact plug in the source doped regions used for connecting the Vss voltage and the Vdd voltage, so that the current leakage problem can be alleviated, and the resistance can also be reduced.

In order to the make the aforementioned and other objects, features and advantages of the present invention comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

FIGS. 1A to 1D are top views illustrating a processing flow of fabricating a static random access memory (SRAM) according to a first embodiment of the present invention. FIGS. 2A to 2D are cross-sectional views along a line I-I' in FIGS. 1A to 1D.

Figure 1A:
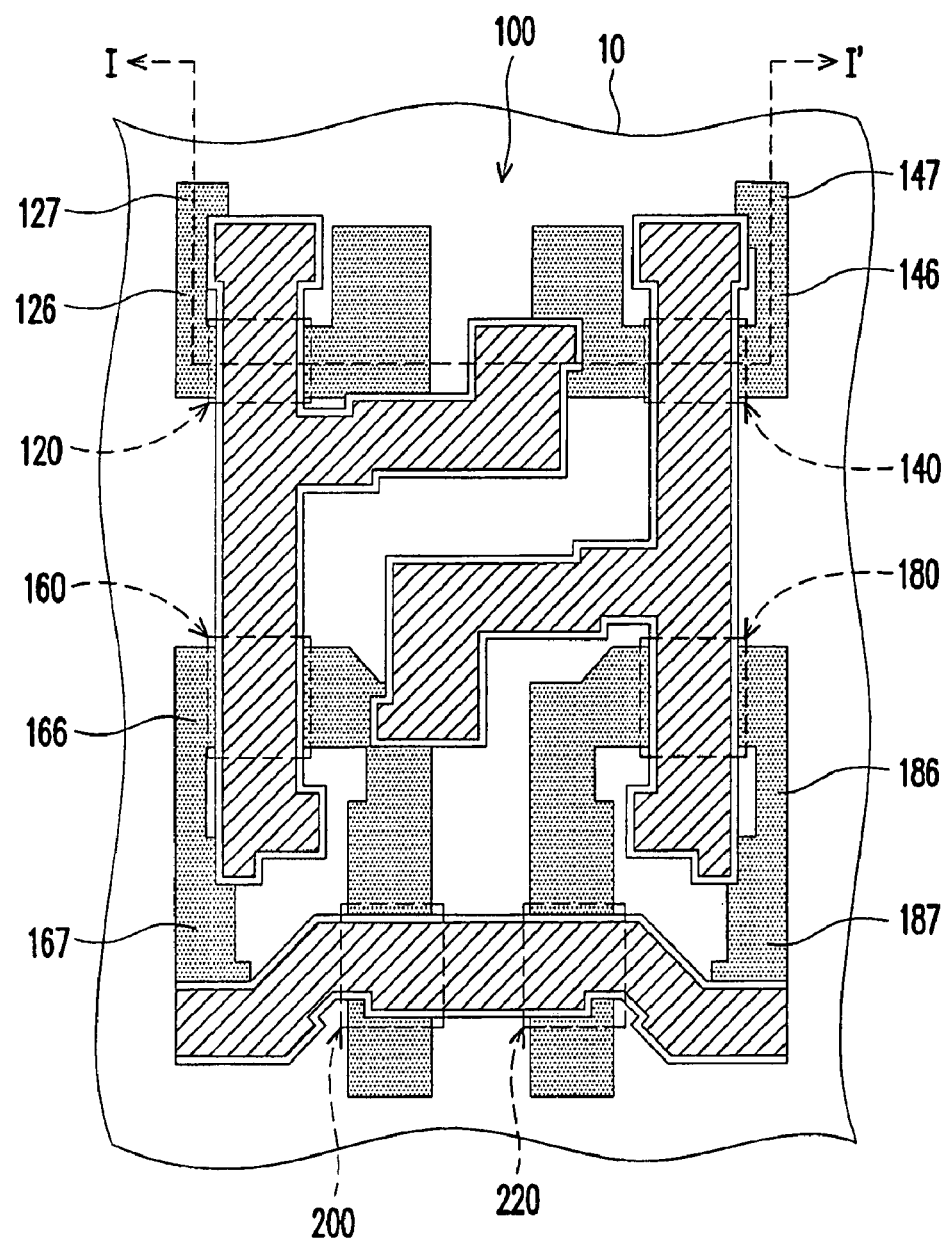
FIGS. 1A to 1D are top views illustrating a processing flow of fabricating a static random access memory (SRAM) according to a first embodiment of the present invention.
Figure 2A:
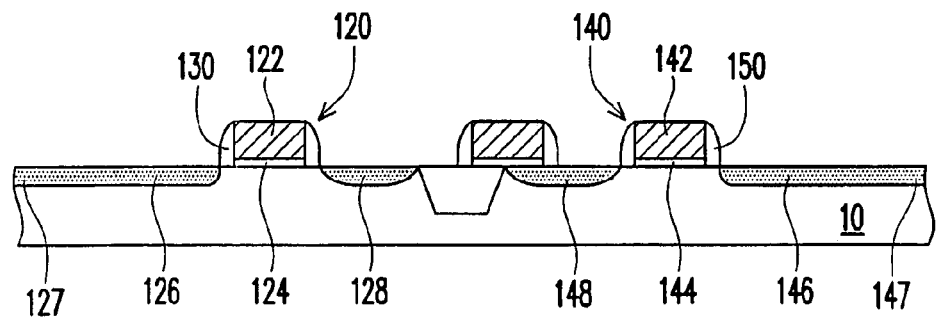
FIGS. 2A to 2D are cross-sectional views along a line I-I' in FIGS. 1A to 1D.

Referring to FIGS. 1A and 2A at first, transistors 120, 140, 160, 180, 200 and 220 are formed on a substrate 10. Each of the transistors includes a gate, a gate dielectric layer, a source doped region, a drain doped region and a spacer. For example, in a cross-sectional view shown by FIG. 2A, the transistor 120 includes a gate 122, a gate dielectric layer 124, a source 126, a drain 128, and a spacer 130. The transistor 140 includes a gate 142, a gate dielectric layer 144, a source 146, a drain 148, and a spacer 150. FIG. 1A merely illustrates a scope of a memory cell 100. Therefore, according to the present embodiment, in the SRAM, a memory cell is formed by 6 transistors. Moreover, a material of the transistors and a fabricating method thereof are well known to one of ordinary skill in the art, and therefore detailed descriptions are omitted. In addition, the transistors 120, 140, 160, 180, 200 and 220 can respectively be either a P-type metal-oxide-semiconductor (MOS) transistor or an N-type MOS transistor.

Referring to FIG. 1A, in the present embodiment, the transistors 120 and 140 are used as load transistors. Therefore, the source doped regions 126 and 146 of the transistors 120 and 140 are used for connecting the Vdd voltage, and the source doped regions 126 and 146 respectively have areas 127 and 147 used for contacting a contact plug. The transistors 160 and 180 are used as driving transistors. Therefore, source doped region 166 and 186 of the transistors 160 and 180 are used for connecting the Vss voltage, and the source doped regions 166 and 186 respectively have areas 167 and 187 used for contacting the contact plug.

Figure 1B:
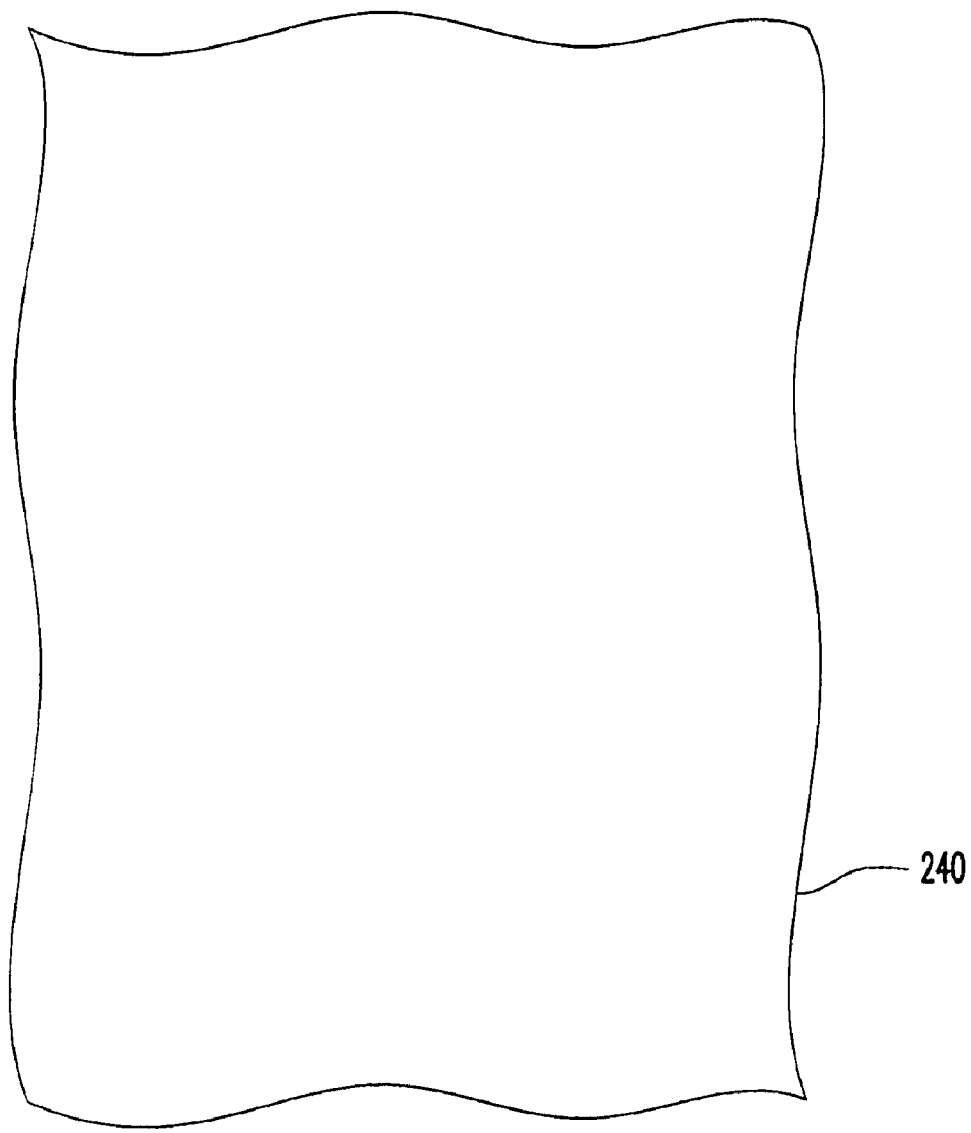
Figure 2B:
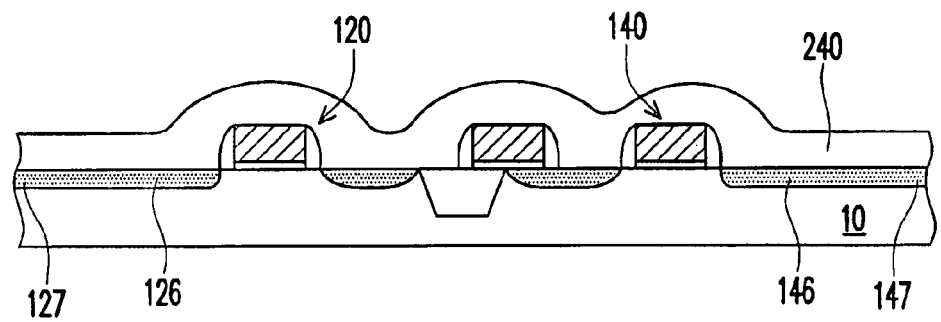

Next, referring to FIGS. 1B and 2B, a salicide blocking film 240 is formed for covering the substrate 10. A method of forming the salicide blocking film 240 includes a chemical vapor deposition process. A material of the salicide blocking film 240 is preferably an insulating material. A common-used insulating material includes, for example, a silicon oxide material, TEOS based silicon oxide, or a silicon nitride material, or so forth.

Figure 1C:
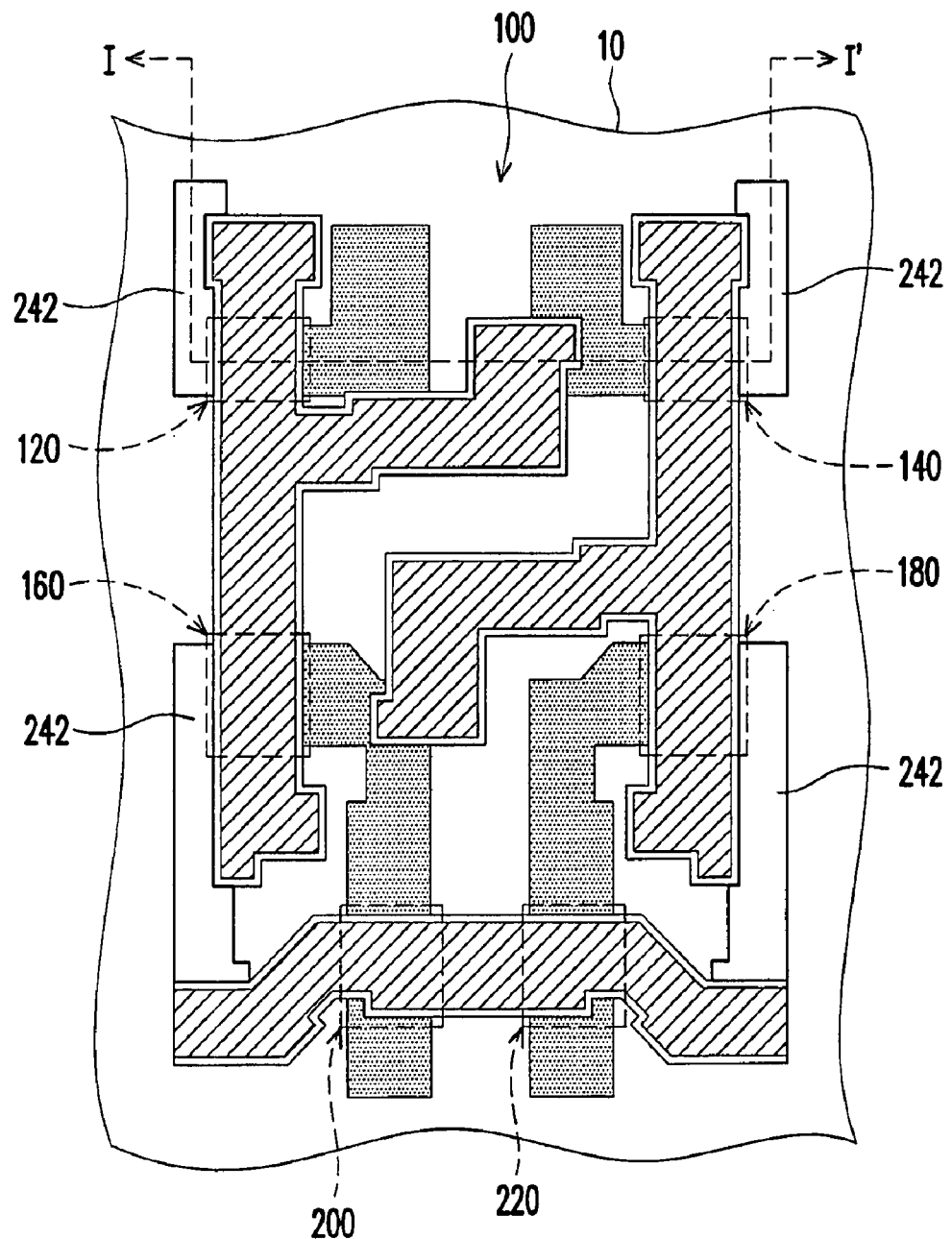
Figure 2C:
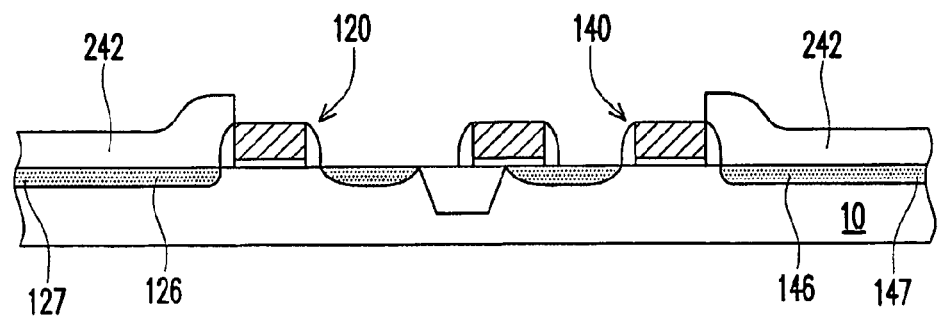

Then, referring to FIGS. 1C and 2C, the salicide blocking film 240 is patterned to remove at least the salicide blocking film 240 on the gates, the source doped regions except the source doped regions 126 and 146 used for connecting the Vdd voltage and the source doped regions 166 and 186 used for connecting the Vss voltage and the drain doped regions in the transistors 120 140, 160, 180, 200 and 220 of the memory cell 100. Therefore, a salicide blocking film 242 is formed on the source doped regions 126 and 146 used for connecting the Vdd voltage and on the source doped regions 166 and 186 used for connecting the Vss voltage. The method of patterning the salicide blocking film 240 includes, for example, forming a photoresist layer (not shown) on the salicide blocking film 240. Then, a photomask (not shown) having a required pattern is used to perform a photolithography process, so that the patterned photoresist layer (not shown) is formed. Next, the salicide blocking film 240 not covered by the patterned photoresist layer is removed by using the photoresist layer as a mask, so that the patterned salicide blocking film of the present embodiment is formed, wherein the patterned salicide blocking film includes the region marked by the reference numeral 242 and other regions not shown. After that, the photoresist layer is removed.

Figure 1D:
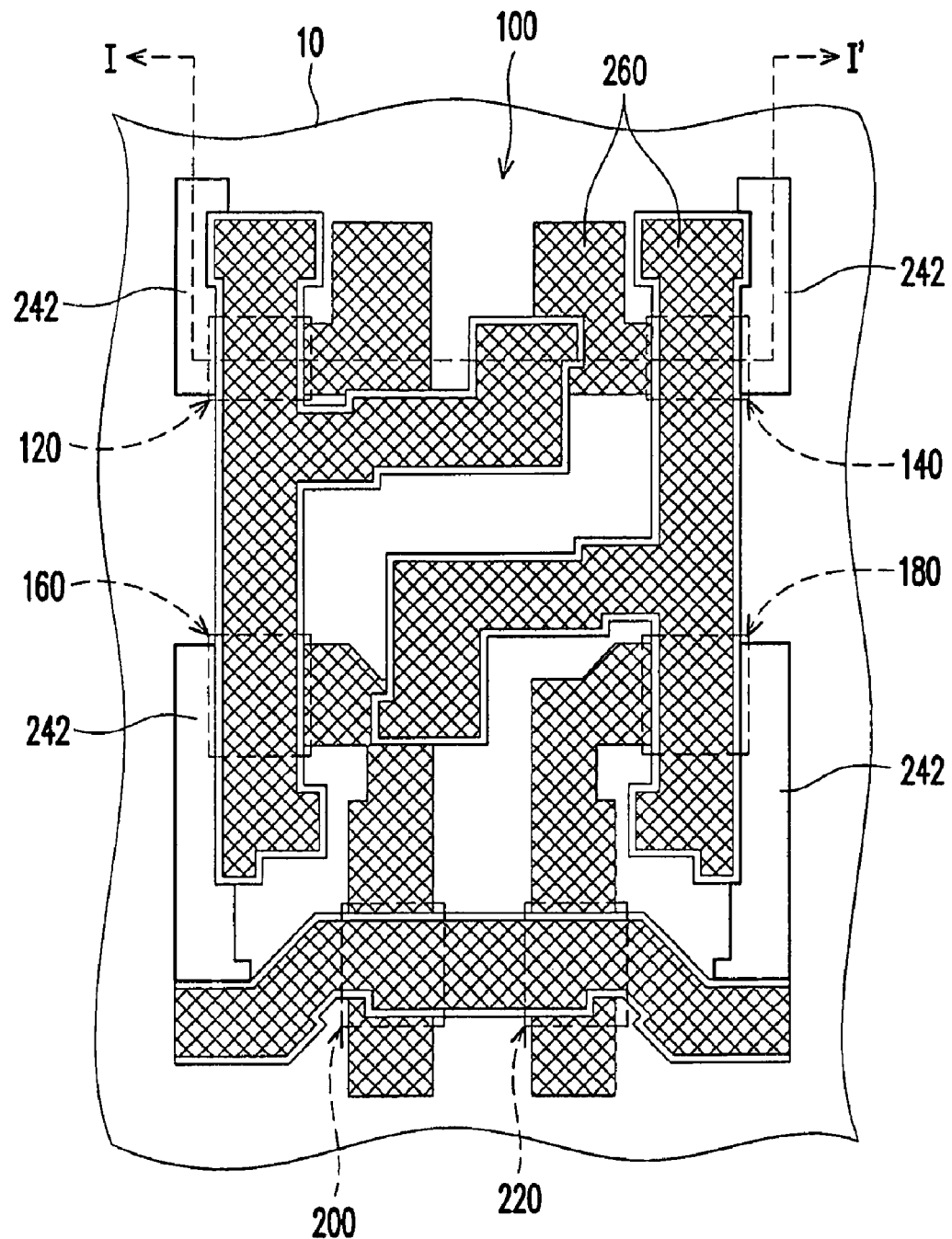
Figure 2D:
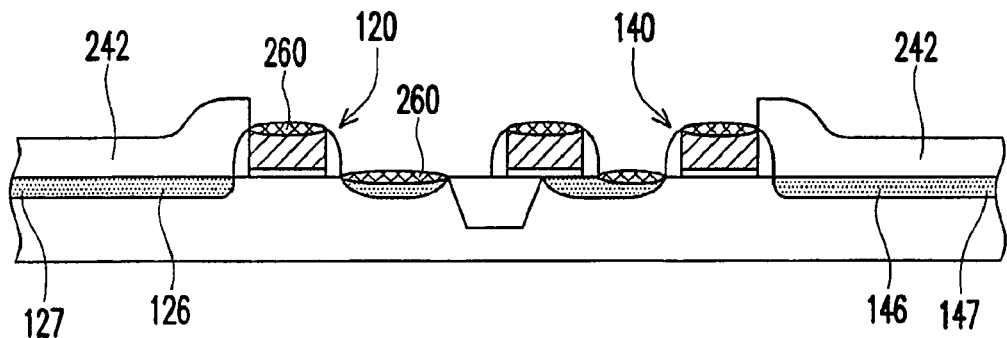

Thereafter, referring to FIGS. 1D and 2D, a salicide process is performed to form a salicide layer 260 on at least the gates, the source doped regions except the source doped regions 126 and 146 used for connecting the Vdd voltage and the source doped regions 166 and 186 used for connecting the Vss voltage and the drain doped regions in the transistors 120, 140, 160, 180, 200 and 220. Therefore the salicide layer 260 is not formed on the source doped regions 126, 146, 166 and 186 used for connecting the Vss voltage and the Vdd voltage. The salicide process includes forming a metal film (not shown) for covering the whole substrate 10. Then, a thermal process is performed to cause the metal film to react with silicon on the gates, source doped regions and drain doped regions in the transistors 120, 140, 160, 180, 200 and 220, and thereby the salicide layer 260 is formed. A material of the metal film includes, for example, cobalt, titanium, tungsten, tantalum, molybdenum, nickel, or so forth. A material of the salicide layer 260 includes, for example, cobalt silicide, titanium silicide, tungsten silicide, tantalum silicide, molybdenum silicide, nickel silicide, or so forth.

The salicide layer 260 is not formed on the spacer 150 and an area which is covered and protected by the salicide blocking film 240.

Next, the un-reacting metal film is removed to expose the salicide layer 260.

Subsequent processes of forming inter-layered dielectric layer, the contact plug, the metal wire are well known to one of ordinary skill in the art, and therefore detailed descriptions are omitted.

It should be noted that the salicide layer is not formed on the source doped regions 126 and 146 used for connecting the Vdd voltage and on the source doped regions 166 and 186 used for connecting the Vss voltage, so that a spiking effect can be prevented, and thereby a current leakage problem can be alleviated. Moreover, although the salicide layer of the present embodiment is not formed on the source doped regions 126, 146, 166 and 186, and it may cause the resistance becomes higher on an area in which the subsequently formed contact plug contacts the source doped regions 126, 146, 166 and 186, the present embodiment is practicable because the source doped regions 126, 146, 166 and 186 are mainly used for providing the voltage, and because a barrier layer (e.g. Ti/TiN) is usually formed in a contact hole when the contact plug is formed, so that the barrier layer directly contacts the source doped regions 126, 146, 166 and 186, and thereby the salicide layer may be formed.

Second Embodiment

Figure 1E:
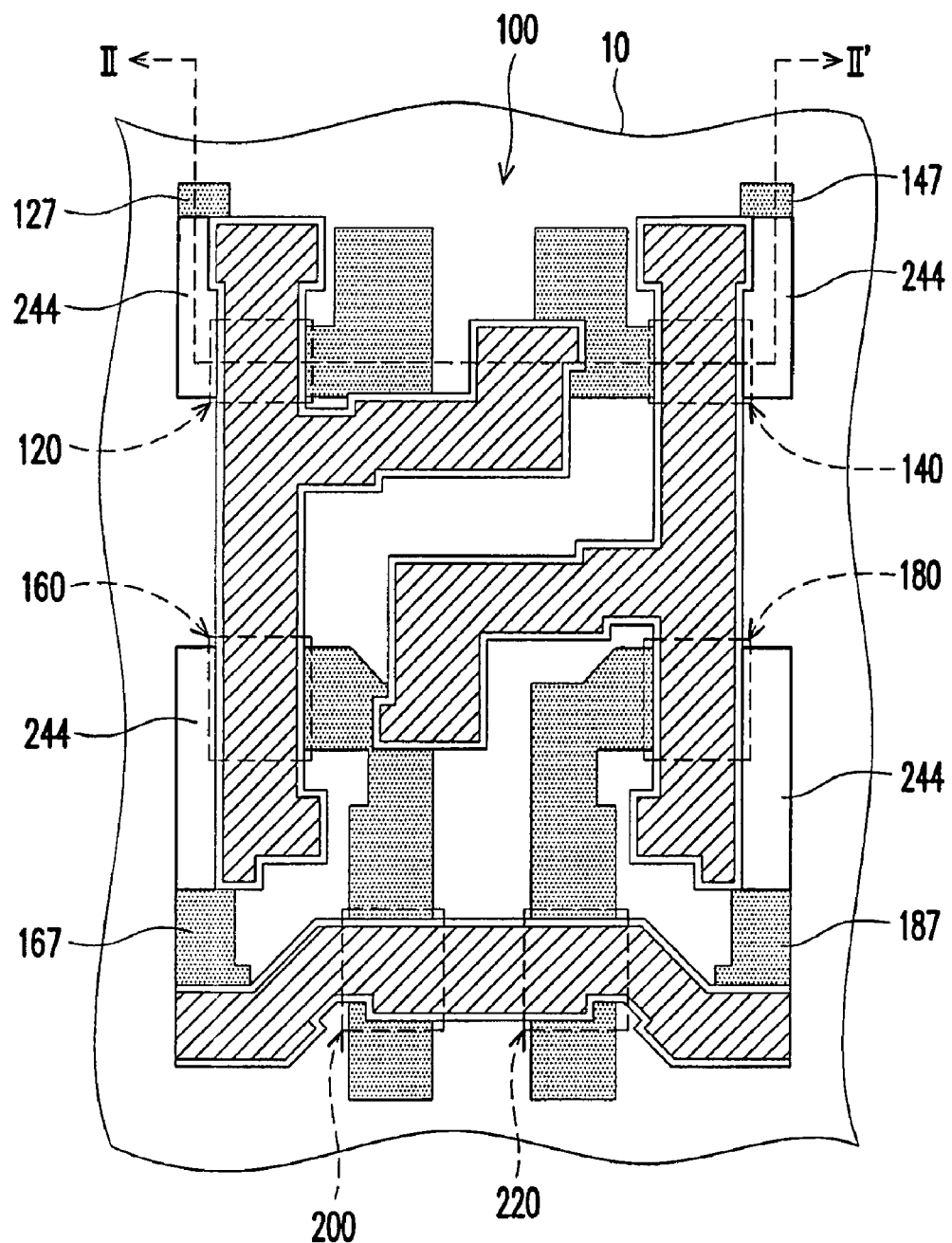
FIGS. 1E to 1F are top views illustrating a processing flow of fabricating an SRAM according to a second embodiment of the present invention.
Figure 1F:
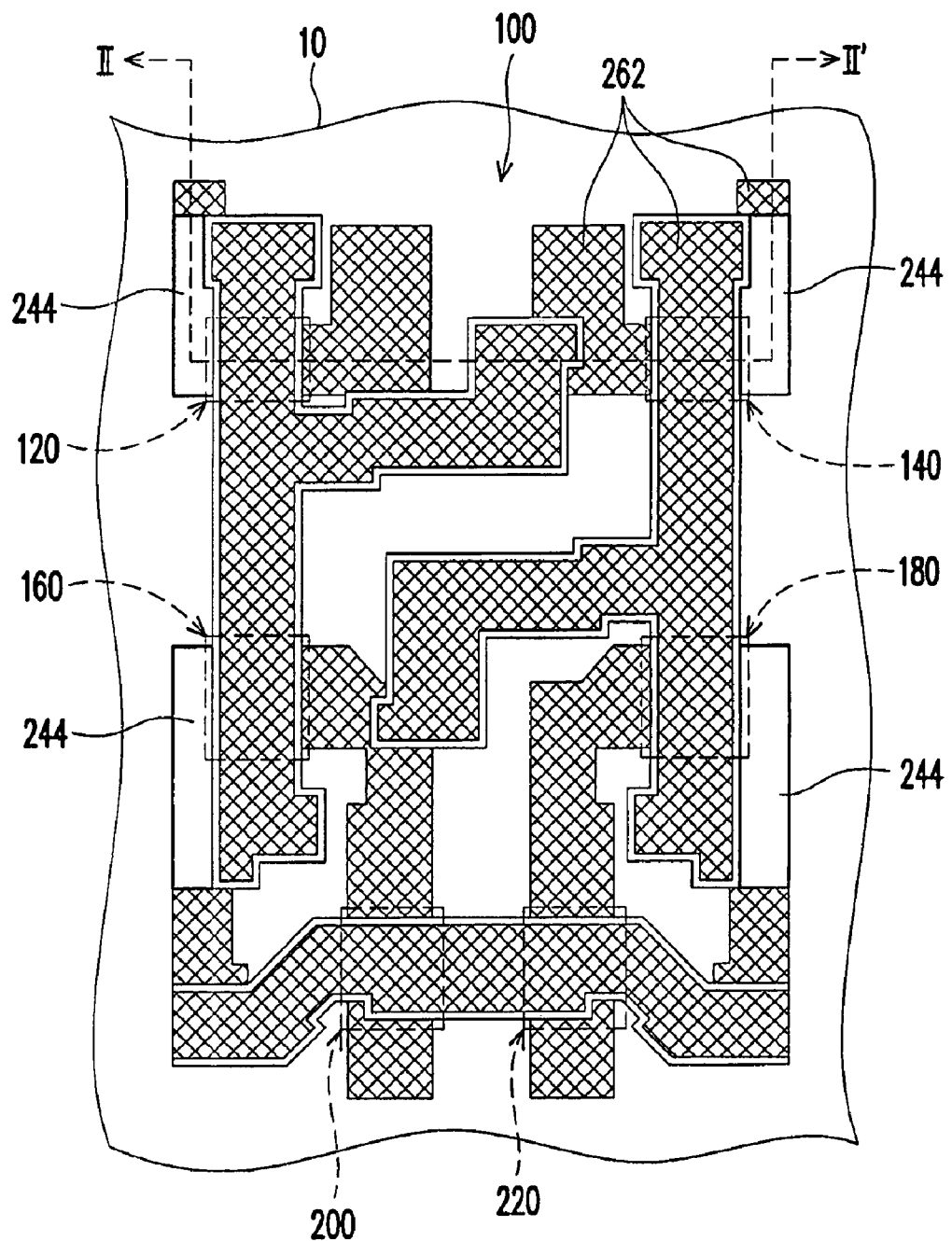
Figure 2E:
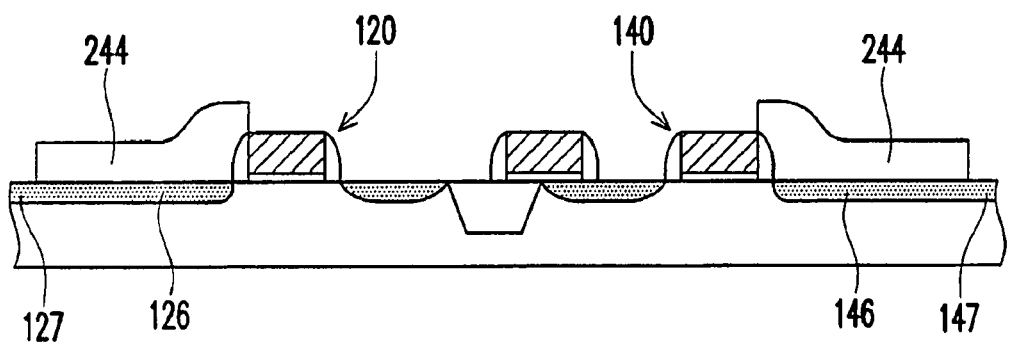
FIGS. 2E to 2F are cross-sectional views along a line II-II' in FIGS. 1E to 1F.
Figure 2F:
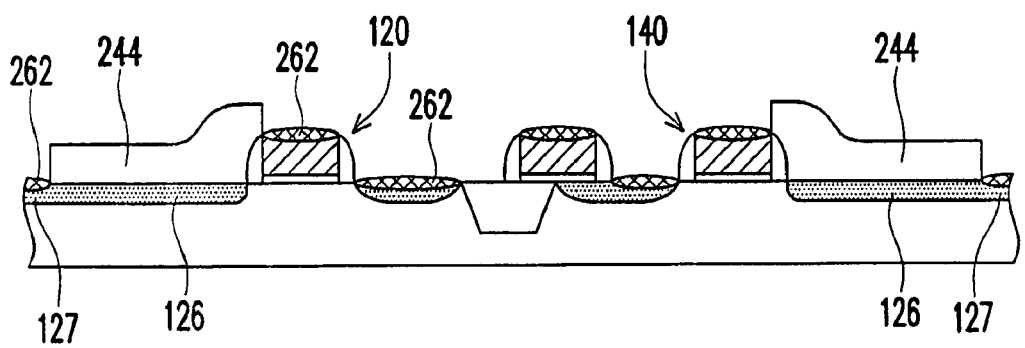

FIGS. 1E to 1F are top views illustrating a processing flow of fabricating an SRAM according to a second embodiment of the present invention. FIGS. 2E to 2F are cross-sectional views along a line II-II' in FIGS. 1E to 1F. The present embodiment is carried out after FIG. 1B of the first embodiment. In FIGS. 1A to 1D and FIGS. 2A to 2D, the same reference numbers are used to refer to the same parts in FIGS. 1E to 1F and FIGS. 2E to 2F, and the same descriptions in regard to the same parts are omitted.

Referring to FIGS. 1E and 2E, a salicide blocking film 240 is patterned to remove at least the salicide blocking film 240 on gates, source doped regions except the source doped regions 126 and 146 used for connecting the Vdd voltage and the source doped regions 166 and 186 used for connecting the Vss voltage, drain doped regions in transistors 120, 140, 160, 180, 200 and 220 and the areas 127, 147, 167 and 187 used for contacting a contact plug in a memory cell 100. Therefore a salicide blocking film 244 is formed on the source doped regions 126 and 146 used for connecting the Vdd voltage and on the source doped regions 166 and 186 used for connecting the Vss voltage except the areas 127, 147, 167 and 187 used for contacting a contact plug. The present embodiment is similar to the first embodiment except the salicide blocking film 244 is not formed on areas 127, 147, 167 and 187 used for contacting a contact plug. According to the present embodiment, in the method of patterning the salicide blocking film 240, a pattern of a photomask is appropriately adjusted by using the method as cited in the first embodiment, so that the salicide blocking film 244 is not formed on the areas 127, 147, 167 and 187 used for contacting the contact plug.

After that, referring to FIGS. 1F and 2F, a salicide process is performed to form a salicide layer 262 on the gates, the source doped regions except the source doped regions 126 and 146 used for connecting the Vdd voltage and the source doped regions 166 and 186 used for connecting the Vss voltage and the drain doped regions in the transistors 120, 140, 160, 180, 200 and 220. Therefore the salicide layer 262 is not formed on the source doped regions 126, 146, 166 and 186 except the areas 127, 147, 167 and 187 used for contacting the contact plug. According to the present embodiment, the salicide process is performed by using the same method as cited in the first embodiment.

Similarly, the subsequent processes of forming an interlayered dielectric layer, the contact plug, a metal wire are well known to one of ordinary skill in the art, and therefore detailed descriptions are omitted.

It should be noted that the salicide layer 262 is not formed on the source doped regions 126, 146, 166 and 186 except the areas 127, 147, 167 and 187 used for connecting the contact plug, so that a resistance of the source doped regions 126, 146, 166 and 186 can be reduced, also a spiking effect caused by the salicide can be prevented, and thereby a current leakage problem can be alleviated.

Third Embodiment

FIGS. 3A to 3D are top views illustrating a processing flow of fabricating an SRAM according to a third embodiment of the present invention. FIGS. 4A to 4D are cross-sectional views along a line III-III' in FIGS. 3A to 3D. In FIGS. 1A to 2F, the same reference numbers are used to refer to the same parts in FIGS. 3A to 4D, and the same descriptions are omitted.

Figure 3A:
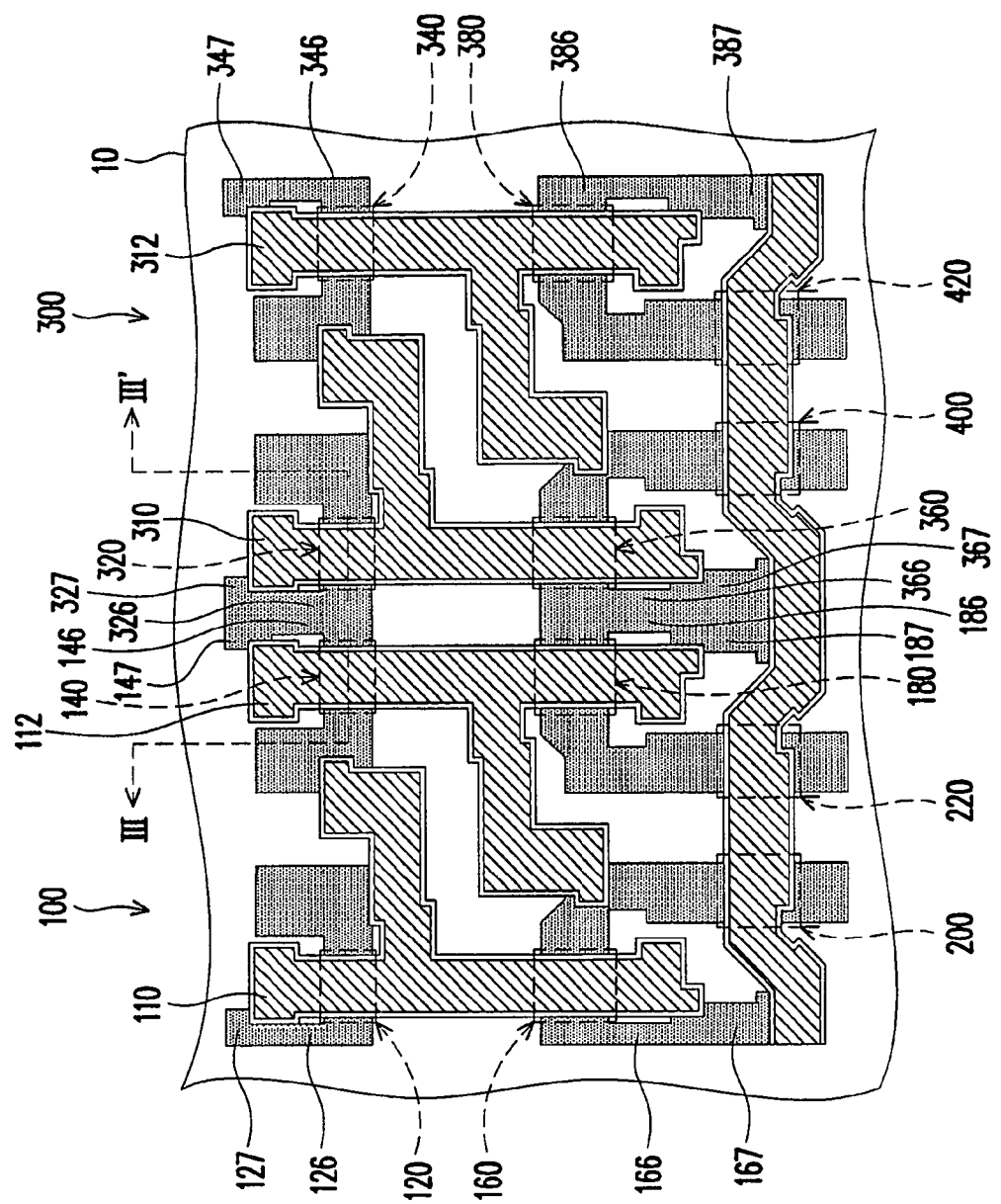
FIGS. 3A to 3D are top views illustrating a processing flow of fabricating an SRAM according to a third embodiment of the present invention.
Figure 4A:
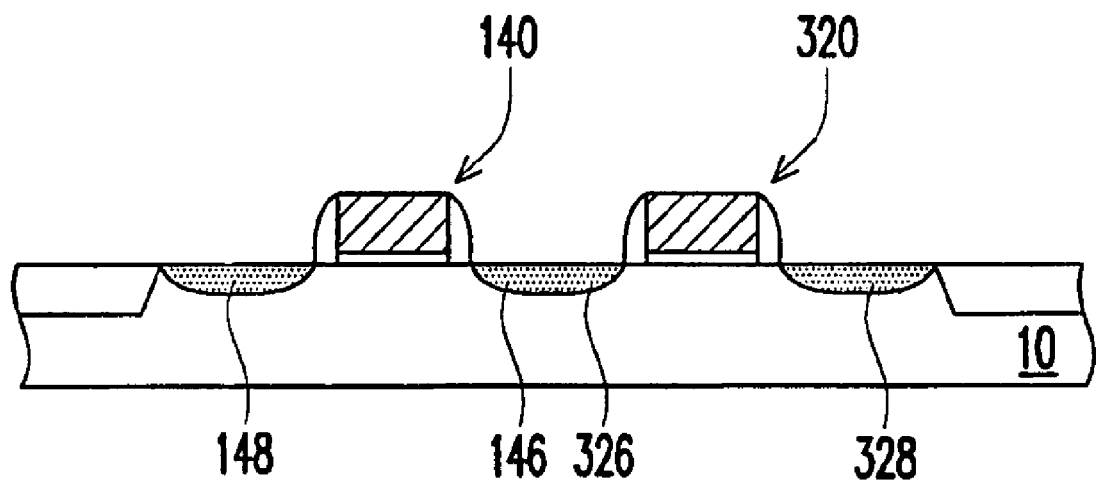
FIGS. 4A to 4D are cross-sectional views along a line III-III' in FIGS. 3A to 3D.

Referring to FIGS. 3A and 4A at first, transistors 120, 140, 160, 180, 200, 220, 320, 340, 360, 380, 400 and 420 are formed on a substrate 10. The transistors 120, 140, 160, 180, 200 and 220 constitute a memory cell 100, while the transistors 320, 340, 360, 380, 400 and 420 constitute a memory cell 300. The two memory cells 100 and 300 are disposed adjacent to each other. The memory cell 100 further includes source doped regions 126 and 146 used for connecting a Vdd voltage, and source doped regions 166 and 186 used for connecting a Vss voltage. The memory cell 300 further includes source doped regions 326 and 346 used for connecting the Vdd voltage, and source doped regions 366 and 386 used for connecting the Vss voltage.

Referring to FIG. 3A, gates of the transistors 140 and 180 in the memory cell 100 are disposed in a gate conductive layer 112, while gates of the transistors 320 and 360 in the memory cell 300 are disposed in a gate conductive layer 310. The source doped regions 146 and 326 of the transistors 140 and 320 are shared by the transistors 140 and 320 and partially disposed on the substrate 10 between the gate conductive layer 112 and the gate conductive layer 310. Moreover, the source doped regions 186 and 366 are shared by the transistors 180 and 360 and partially disposed on the substrate 10 between the gate conductive layer 112 and the gate conductive layer 310. Similarly, the source doped regions 126 and 166 at the other side of the memory cell 100 are shared in use and partially disposed on the substrate 10 between the gate conductive layer 110 and the gate conductive layer (not shown) adjacent to the memory cell. The source doped regions 346 and 386 at the other side of the memory cell 300 are shared in use and partially disposed on the substrate 10 between the gate conductive layer 312 and the gate conductive layer (not shown) adjacent to the memory cell.

In addition, as shown in FIG. 4A, the line III-III' in FIG. 4A only sections the shared source doped regions 146 and 326 between the two memory cells 100 and 300, the transistors 140 and 320, and the drain doped regions 148 and 328.

Figure 3B:
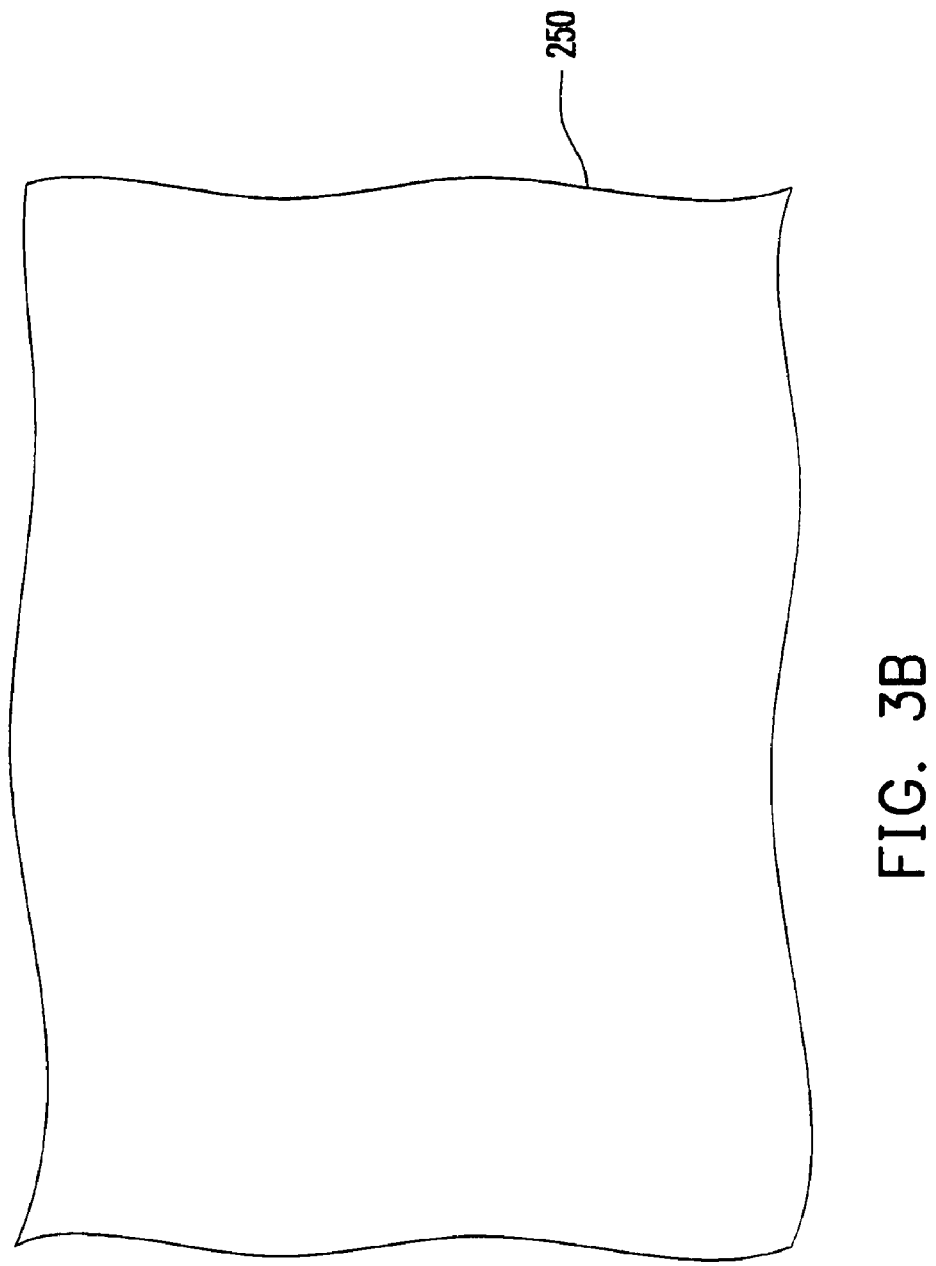
Figure 4B:
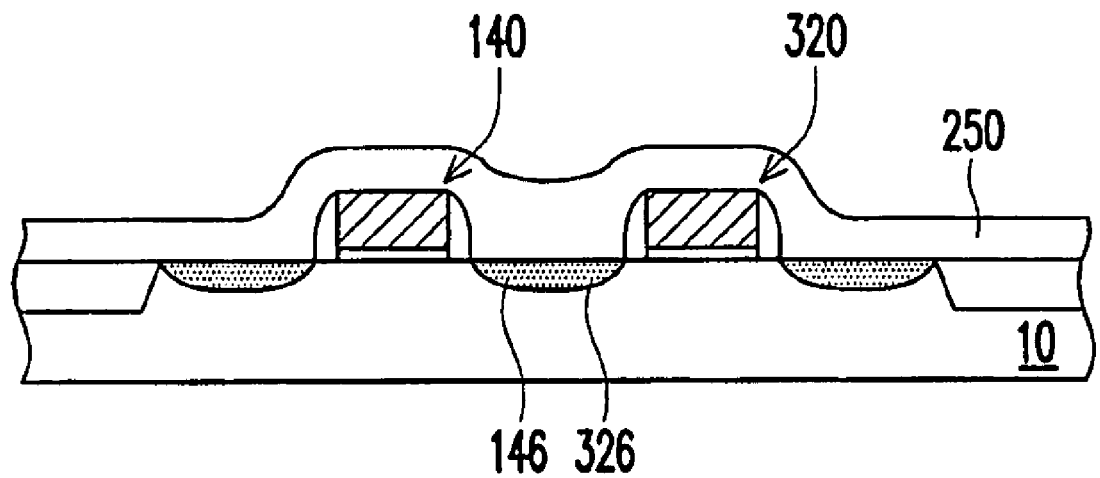

Thereafter, referring to FIGS. 3B and 4B, a salicide blocking film 250 is formed to cover the substrate 10. A thickness of the salicide blocking film 250 is sufficiently to completely fill an opening between the gate conductive layers 112 and 310 (the transistors 140 and 320 in FIG. 4B), so that the thickness of the salicide blocking film 250 is larger than a height of the gate conductive layers 112 and 310. A material of the self-aligned blocking film 250 and a method of forming the same can be, for example, those as cited in the first embodiment.

Figure 3C:
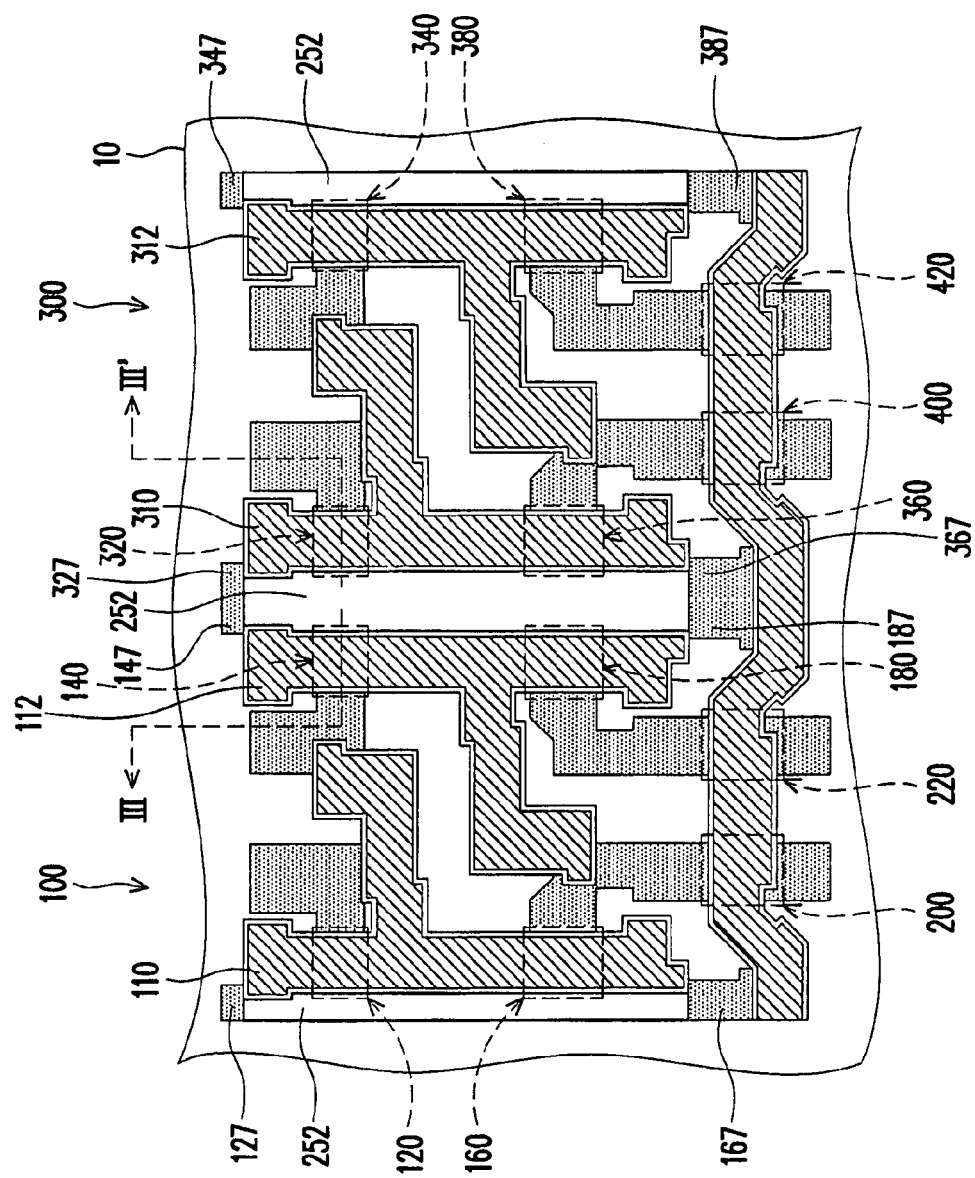
Figure 4C:
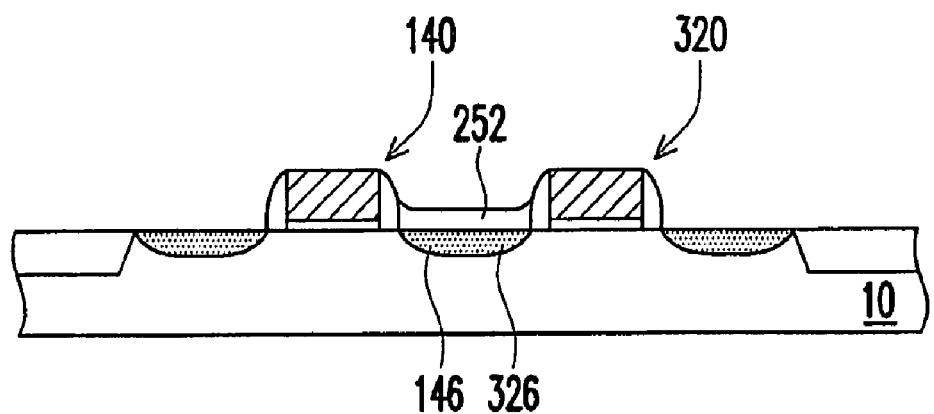

Afterwards, referring to FIGS. 3C and 4C, the salicide blocking film 250 is patterned to form a salicide blocking film 252 on the substrate 10 between the gate conductive layers 112 and 310 and to expose the gates, the source doped regions outside an area between the gate conductive layers 112 and 310, and the drain doped regions in the transistors 120, 140, 160, 180, 200, 220, 320, 340, 360, 380, 400 and 420 of the memory cells 100 and 300. The method of patterning the salicide blocking film 250 includes, for example, forming a photoresist layer (not shown) having a required pattern. Then, the salicide blocking film 250 is removed by using the photoresist layer as a mask. Because the thickness of the salicide blocking film 250 between the gate conductive layers 112 and 310 is sufficient, when the salicide blocking film 250 is removed to expose the gates, and the source doped regions outside the area between the gate conductive layers 112 and 310, and the drain doped regions, a salicide blocking film 252 is formed between the gate conductive layers 112 and 310. The photoresist layer is then removed. Furthermore, by using the same principle, the salicide blocking film 252 is formed respectively between the gate conductive layers 110 and 312 and between the gate conductive layers of adjacent to the SRAM (not shown).

Figure 3D:
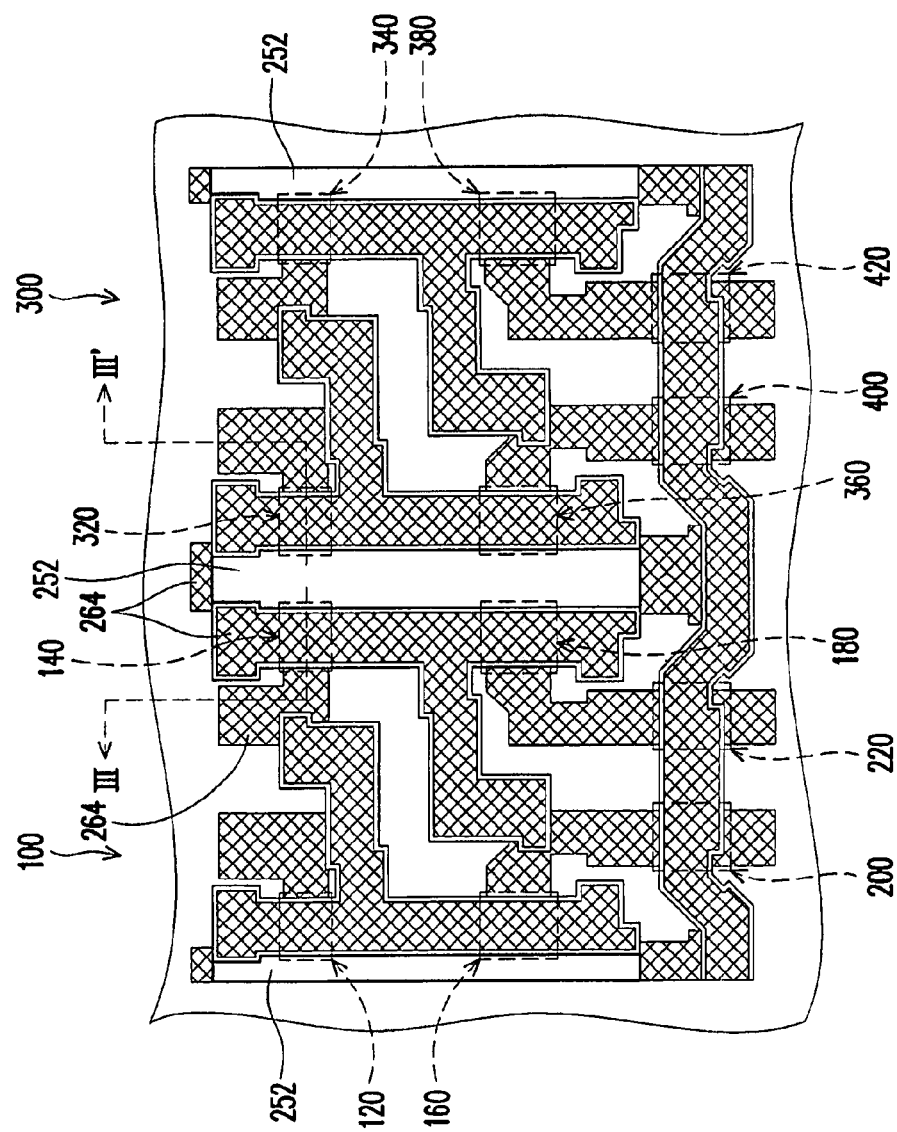
Figure 4D:
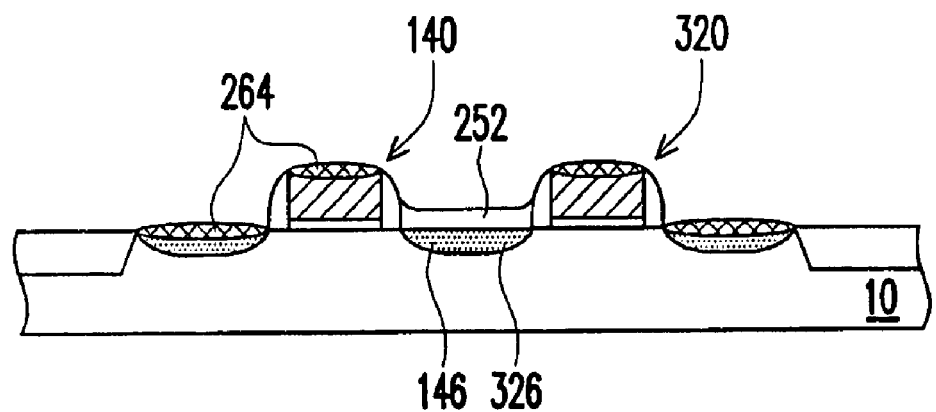
Figure 2A:
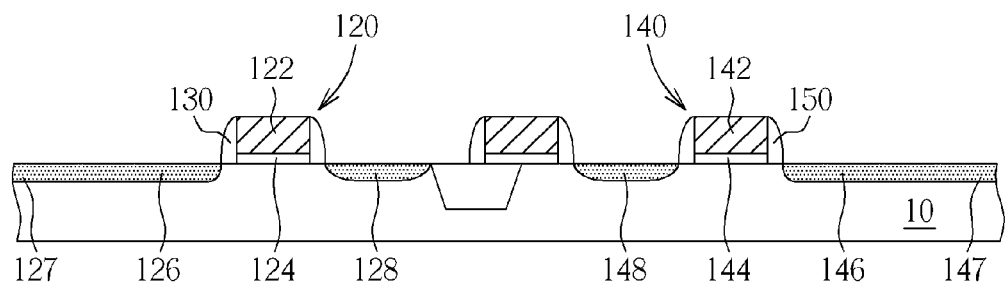
Figure 2B:
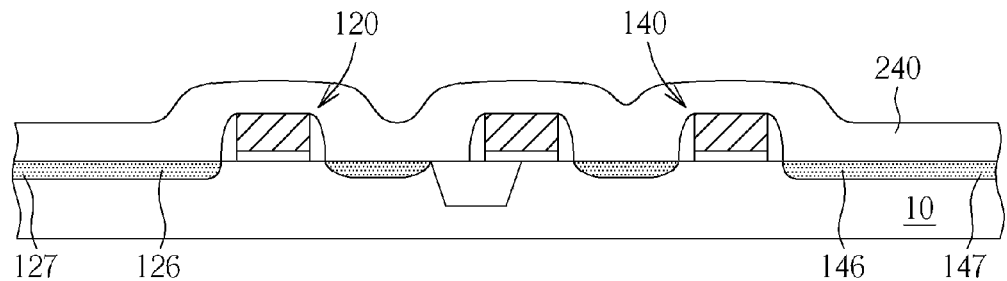
Figure 2C:
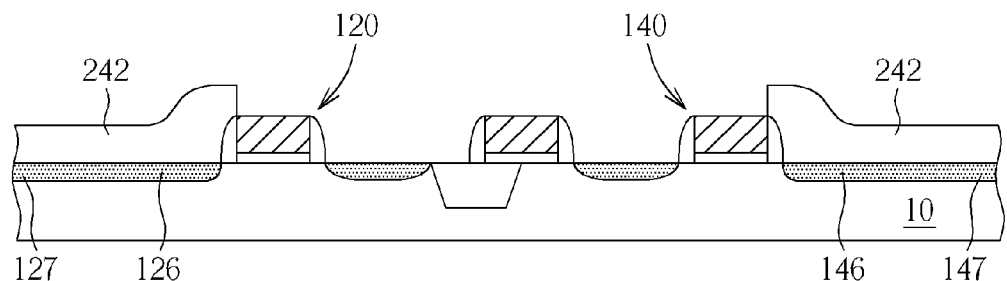
Figure 2D:
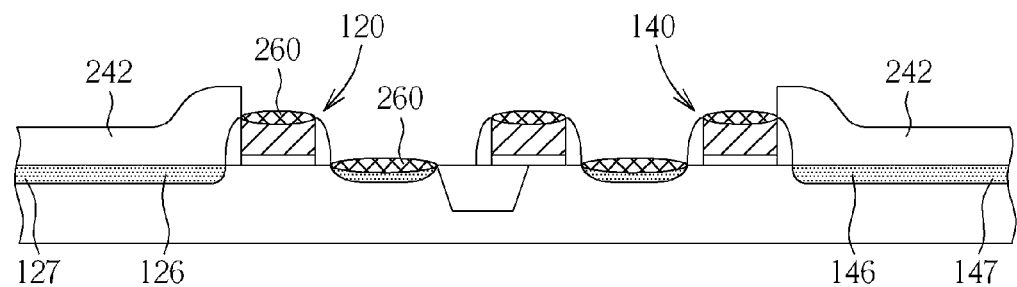
Figure 2E:
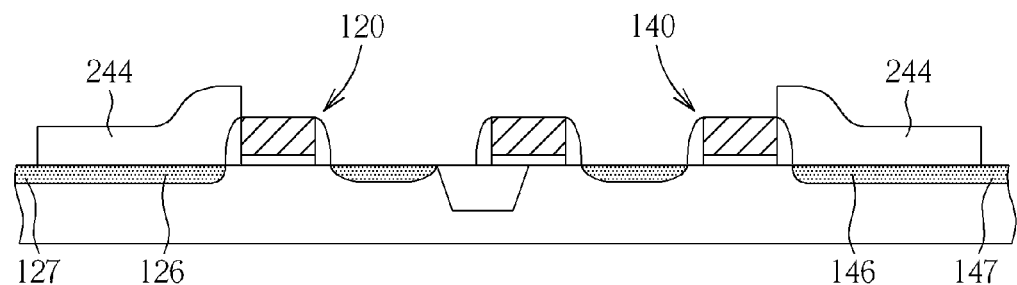
Figure 2F:
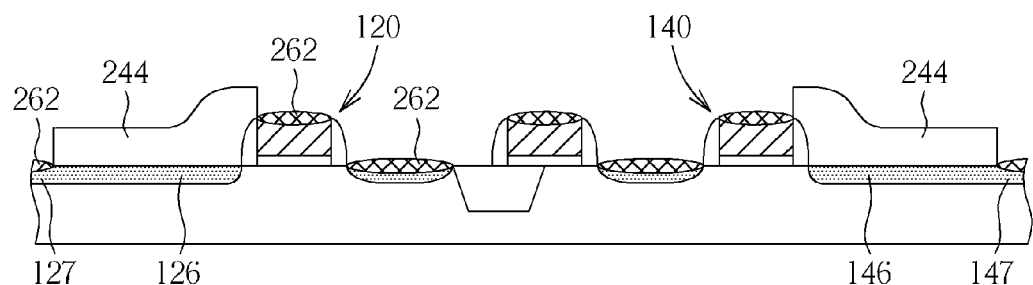

Then, referring to FIGS. 3D and 4D, a salicide process is performed to form a salicide layer 264 on at least the gates, the source doped regions outside the area between the gate conductive layers 112 and 310, and the drain doped regions in the transistors 120, 140, 160, 180, 200, 220, 320, 340, 360, 380, 400 and 420. However, the salicide layer 264 is not formed on the source doped regions 146, 326, 186 and 366 between the gate conductive layers 112 and 310. Similarly, the salicide layer is not formed on the source doped regions 126 and 166 between the gate conductive layer 110 and an adjacent gate conductive layer (not shown), and on the source doped regions 346 and 386 between the gate conductive layer 312 and an adjacent gate conductive layer (not shown). In addition, according to the present embodiment, the areas 127, 147, 167, 187, 327, 347, 367 and 387 are in the source doped regions 126, 146, 166, 186, 326, 346, 366, 386 and the areas 127, 147, 167, 187, 327, 347, 367 and 387 used for contacting the contact plug are not disposed in the area in which the salicide layer is not formed between the two neighboring gate conductive layers. Therefore, the salicide layer 264 is formed on the areas 127, 147, 167, 187, 327, 347, 367 and 387 used for contacting the contact plug. According to the present embodiment, the salicide process is performed by using the same method as cited in the first embodiment.

Subsequent processes of forming the inter-layered dielectric layer, the contact plug, the metal wire are well known to one of ordinary skill in the art, and therefore detailed descriptions are omitted.

It should be noted that the source doped regions 126, 146, 166, 186, 326, 346, 366 and 386 are disposed in the substrate 10 among the two neighboring gate conductive layers by using a proper design for the layout of the SRAM in the present embodiment. Therefore, the salicide blocking film 250 having the sufficient thickness can be formed, and thereby the salicide layer is not formed on the source doped regions 126, 146, 166, 186, 326, 346, 366 and 386 between the two neighboring gate conductive layers. Consequently, a spiking effect caused by the salicide layer can be prevented, and thereby a current leakage problem can be alleviated. Furthermore, when the areas 127, 147, 167, 187, 327, 347, 367, 387 used for contacting the contact plug are not disposed among the gate conductive layers 110, 112, 310 and 312, the salicide layer 264 is formed on the areas 127, 147, 167, 187, 327, 347, 367, 387 used for contacting the contact plug, and thereby the resistance is reduced.

Moreover, the present embodiments are a 6T SRAM in which a memory cell is constituted by 6 transistors. However, the present invention is not limited thereto, a memory cell of the SRAM according to the present invention can be constituted by 4, 8 or 12 transistors.

In light of the above, according to the present invention, in the SRAM and the fabricating method thereof, because the salicide layer is not formed on the source doped region used for connecting the Vss voltage and the Vdd voltage in the transistor, the spiking effect caused by the salicide layer can be prevented, thereby reducing the current leakage problem.

In addition, according to the present invention, in the SRAM and the fabricating method thereof, the salicide layer is not formed on the source doped regions used for connecting the Vss voltage and Vdd voltage in the transistor except the area used for contacting the contact plug in the source doped regions used for connecting the Vss voltage and the Vdd voltage, and thereby the problem of current leakage can be alleviated, and the resistance of the source doped region can also be reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A static random access memory (SRAM), the SRAM at least comprising:
   a plurality of transistors disposed on a substrate, wherein each of the transistors at least comprises a gate, a gate dielectric layer, a source doped region and a drain doped region, and some of the source doped regions are used for connecting a Vss voltage or a Vdd voltage; and
   a salicide layer disposed on the gates, the source doped regions except those source doped regions used for connecting a Vss voltage and a Vdd voltage and the drain doped regions.

2. The SRAM according to claim 1, wherein each source doped region used for connecting the Vss voltage and the Vdd voltage further comprises an area used for contacting a contact plug, and the salicide layer is formed on the area used for connecting the contact plug.

3. The SRAM according to claim 1, wherein the SRAM includes a memory cell constituted by a plurality of the transistors, and a number of the transistors in each of the memory cells is 4, 6, 8 or 12.

4. The SRAM according to claim 1, wherein the transistors includes a P-type metal-oxide-semiconductor (MOS) transistor or an N-type MOS transistor.

5. The SRAM according to claim 1, wherein a material of the salicide layer includes cobalt silicide, titanium silicide, tungsten silicide, tantalum silicide, molybdenum silicide or nickel silicide.

6. A fabricating method of an SRAM, comprising:
   forming a plurality of transistors disposed on a substrate, wherein each of the transistors at least comprises a gate, a gate dielectric layer, a source doped region and a drain doped region, and some of the source doped regions are used for connecting a Vss voltage or a Vdd voltage; and forming a salicide layer on the gates, the source doped regions except those source doped regions used for connecting a Vss voltage and a Vdd voltage and the drain doped regions.

7. The fabricating method of the SRAM according to claim 6, wherein a step of forming the salicide layer includes:

forming a salicide blocking film on the substrate;

patterning the salicide blocking film to expose the gates, the source doped regions except the source doped regions used for connecting the Vss voltage and the Vdd voltage, and the drain doped regions; and forming the salicide layer on the exposed gates, the exposed source doped regions and the exposed drain doped regions.

8. The fabricating method of the SRAM according to claim 7, wherein a material of the salicide blocking film includes silicon oxide or silicon nitride.

9. The fabricating method of the SRAM according to claim 6, wherein a material of the salicide layer includes cobalt silicide, titanium silicide, tungsten silicide, tantalum silicide, molybdenum silicide or nickel silicide.

10. The fabricating method of the SRAM according to claim 6, wherein each source doped region used for connecting the Vss voltage and the Vdd voltage further comprising an area used for contacting a contact plug, and the step of forming the salicide layer comprising:

forming the salicide layer on the gates, the source doped regions except those source doped regions used for connecting a Vss voltage and a Vdd voltage, the drain doped regions and the areas used for contacting the contact plug.

11. The fabricating method of the SRAM according to claim 10, the step of forming the salicide layer further comprising:

forming a salicide blocking film on the substrate;

patterning the salicide blocking film to expose the gates, the source doped regions except the source doped regions used for connecting the Vss voltage and the Vdd voltage, the drain doped regions, and the areas used for contacting the contact plug; and forming the salicide layer on the exposed gates, the exposed source doped regions, the exposed drain doped regions, and the exposed areas used for contacting the contact plug.

12. The fabricating method of the SRAM according to claim 11, wherein a material of the salicide blocking film includes silicon oxide or silicon nitride.

13. The fabricating method of the SRAM according to claim 6, wherein the source doped regions used for connecting the Vss voltage or the Vdd voltage are disposed between two of the gates in some of the gates, and the step of forming the salicide layer comprising:

forming the salicide blocking film on the substrate, wherein between two of the gates, a thickness of the salicide blocking film is larger than a height of the gate;

removing parts of the salicide blocking for forming the patterned salicide blocking film on the substrate between the two gates and for exposing the gates, the source doped regions outside an area between the two gates, and the drain doped regions; and forming the salicide layer on the exposed gates, the exposed source doped regions and the exposed drain doped regions.

14. The fabricating method of the SRAM according to claim 13, wherein a material of the salicide blocking film includes silicon oxide or silicon nitride.

15. The fabricating method of the SRAM according to claim 6, wherein the SRAM includes a memory cell constituted by a plurality of the transistors, and a number of the transistors in each of the memory cells is 4, 6, 8 or 12.

16. The fabricating method of the SRAM according to claim 6, wherein the transistor can be a P-type MOS transistor or an N-type MOS transistor.

* * * * *